United States Patent
Deng et al.

(10) Patent No.: US 8,890,731 B2
(45) Date of Patent: Nov. 18, 2014

(54) CONVERSION CIRCUIT AND CHIP

(71) Applicant: Huawei Technologies Co., Ltd., Guangdong (CN)

(72) Inventors: Peter Kaiping Deng, Shanghai (CN); Tao Xiong, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/084,309

(22) Filed: Nov. 19, 2013

(65) Prior Publication Data

US 2014/0143624 A1    May 22, 2014

(30) Foreign Application Priority Data

Nov. 20, 2012   (CN) .......................... 2012 1 0472164

(51) Int. Cl.
*H03M 1/10*     (2006.01)
*G06F 11/25*    (2006.01)

(52) U.S. Cl.
CPC ..................................... *G06F 11/25* (2013.01)
USPC ........................... 341/120; 341/144; 341/155

(58) Field of Classification Search
CPC ............ H03M 1/1095; H03M 1/1071; H03M 1/1019; H03M 1/0604; H03M 1/109; H03M 1/10
USPC ........................... 341/144, 155, 110, 118, 120
See application file for complete search history.

(56) References Cited

U.S. PATENT DOCUMENTS

| 6,320,528 | B1 * | 11/2001 | Michel | 341/144 |
| 6,557,131 | B1 * | 4/2003 | Arabi | 714/734 |
| 7,154,422 | B2 * | 12/2006 | Wen | 341/120 |
| 7,271,751 | B2 * | 9/2007 | Peterson et al. | 341/120 |
| 8,294,604 | B2 * | 10/2012 | Lai | 341/120 |
| 8,314,725 | B2 * | 11/2012 | Zepeda et al. | 341/120 |

OTHER PUBLICATIONS

Huang et al., "A BIST Scheme for On-Chip ADC and DAC Testing," Proceedings of the Conference on Design, Automation and Test in Europe, pp. 216-220 (2000).
Li et al., "A New BIST Structure for ADC Test in Mixed-Signal Circuits," Microelectronics, vol. 34, No. 4 (Aug. 2004).

* cited by examiner

*Primary Examiner* — Peguy Jean Pierre
(74) *Attorney, Agent, or Firm* — Leydig, Voit & Mayer, Ltd.

(57) ABSTRACT

The present invention provides a conversion circuit including: an inputting unit, a DAC connected to the inputting unit, an ADC connected to an output end of the DAC, and a comparing unit connected to an output end of the ADC. The comparing unit compares a test code set output by the ADC with a second standard test code set, and if the comparison result is in a preset error range, notify a test data collecting unit; otherwise, output the comparison result to a correcting unit. The correcting unit obtains a complementary code set according to the comparison result, and output the complementary code set to the inputting unit, so that the inputting unit updates the standard test code set according to the complementary code set and obtains the updated first standard test code set. The test data collecting unit obtains a voltage value of an input end of the ADC.

13 Claims, 2 Drawing Sheets

CONVERSION CIRCUIT AND CHIP

CROSS-REFERENCE TO RELATED APPLICATION

This application claims priority to Chinese Patent Application No. 201210472164.5, filed on Nov. 20, 2012, which is hereby incorporated by reference in its entirety.

TECHNICAL FIELD

Embodiments of the present invention relate to circuit technologies, and in particular, to a conversion circuit and a chip.

BACKGROUND

In industrial applications, static parameters of an analog-to-digital converter (Analog-to-Digital Converter, ADC) need to be calculated. For the calculation of the static parameters of the ADC, it is required that an output code and a corresponding input voltage of the ADC need to be collected. However, because the transmission performance curve of the ADC is a many-to-one mapping function, the existing test circuit for testing the ADC is complex, and the required test time is rather long.

For example, in the prior art, a method such as a linear staircase histogram method or a bar chart method based on multi-point sampling is used to test the static parameters of the ADC, for example, an integral nonlinearity value (Integral nonlinearity, INL), a differential nonlinearity value (Differential Nonlinearity, DNL), and a gain error.

The linear staircase histogram method or the bar chart method is a statistical method, featuring randomness and roughness and incapable of determining the input voltage value of the ADC according to the output code output by the ADC. In the process of testing the ADC, a more accurate test result can be obtained only under conditions of sufficient sampling points, and consequently, the test time is rather long.

For example, for a 10-bit ADC, if the histogram method is used, the number of sampling points is $(2^{10}) \times 16 = 1024 \times 16 = 16384$, and the sampling time is rather long.

Therefore, how to design a conversion circuit for shortening the ADC test time becomes a technical problem to be solved at present.

SUMMARY

Accordingly, in view of the defects in the prior art, the present invention provides a conversion circuit and a chip to solve the problem in the prior art that a long test time is required for testing an ADC.

In a first aspect, an embodiment of the present invention provides a conversion circuit. The conversion circuit includes an inputting unit, a digital-to-analog converter DAC, an analog-to-digital converter ADC, a comparing unit, a correcting unit, and a test data collecting unit. The inputting unit is configured to input standard test codes in a first standard test code set to an input end of the digital-to-analog converter DAC; the digital-to-analog converter DAC is configured to receive the standard test codes input by the inputting unit, perform digital-to-analog conversion processing for the received standard test codes, and output, through an output end, an analog signal obtained after conversion; the analog-to-digital converter ADC is configured to receive, through an input end, the analog signal output by the DAC, perform analog-to-digital conversion processing for the analog signal, and generate a test code set formed by digital signals; the comparing unit is configured to compare the test code set output by the ADC with a second standard test code set, and if the comparison result is in a preset error range, notify the test data collecting unit, or if the comparison result is beyond a preset error range, output the comparison result to the correcting unit; the correcting unit is configured to obtain a complementary code set according to the comparison result when the comparison result in the comparing unit is beyond the preset error range, and input the complementary code set to the inputting unit, so that the inputting unit updates the first standard test code set according to the complementary code set; the test data collecting unit is configured to obtain a voltage value of the input end of the ADC when the comparison result in the comparing unit is in the preset error range, so as to calculate static parameters of the ADC according to the voltage value; and the inputting unit is further configured to receive the complementary code set output by the correcting unit, update the first standard test code set according to the complementary code set, obtain the updated first standard test code set, and input the test codes in the updated first standard test code set to the input end of the DAC.

In combination with the first aspect, in a possible implementation manner, the output end of the DAC is connected to the input end of the ADC through a test board.

In combination with the first aspect and the preceding possible implementation manner, in a second possible implementation manner, the standard test codes are decimal linear monotonic codes.

In combination with the first aspect and the preceding possible implementation manners, in a third possible implementation manner, the conversion circuit further includes:

an operational amplifier, configured to amplify the analog signal output by the DAC, and input the amplified an analog signal to the ADC;

where, a first input end of the operational amplifier is connected to the output end of the DAC, a second input end of the operational amplifier is grounded, and an output end of the operational amplifier is connected to the input end of the ADC.

In combination with the first aspect and the preceding possible implementation manners, in a fourth possible implementation manner, the test data collecting unit includes a digital converter and a register, where the digital converter is configured to collect the voltage value at the input end of the ADC, and store the voltage value collected at the input end of the ADC into the register.

In combination with the first aspect and the preceding possible implementation manners, in a fifth possible implementation manner, the test data collecting unit is further configured to obtain a voltage value of the output end of the DAC, for calculating static parameters of the DAC.

In combination with the first aspect and the preceding possible implementation manners, in a sixth possible implementation manner, the second standard test code set includes code steps corresponding to code steps in the first standard test code set on a one-to-one basis, and the comparing unit is specifically configured to: subtract a corresponding code step in the second standard test code set from each code step in the test code set output by the ADC, obtain a difference corresponding to each code step in the test code set, determine whether the difference corresponding to the code step falls within the preset error range, and if yes, notify the test data collecting unit; otherwise, output the difference to the correcting unit; and correspondingly, the correcting unit is specifically configured to: if the difference corresponding to any code step in the test code set falls beyond the preset error range, obtain the difference corresponding to each code step in the test code set, form a complementary code set by using the differences respectively corresponding to all the code steps in the test code set, and input the complementary code set to the inputting unit; where, an arrangement sequence of the differences in the complementary code set is the same as an arrangement sequence of the standard test codes in the first standard test code set.

In combination with the first aspect and the preceding possible implementation manners, in a seventh possible implementation manner, the inputting unit is specifically configured to: input the standard test codes in the first standard test code set to the input end of the digital-to-analog converter DAC, receive the complementary code set output by the correcting unit, summate each difference in the complementary code set and a corresponding standard test code in the first standard test code set, and form the updated first standard test code set by using all the standard test codes after summation.

In a second aspect, an embodiment of the present invention also provides a test circuit. The test circuit includes an inputting unit, a digital-to-analog converter DAC, a comparing unit, a correcting unit, and a test data collecting unit. The inputting unit is configured to input standard test codes in a first standard test code set to an input end of the digital-to-analog converter DAC; the digital-to-analog converter DAC is configured to receive the standard test codes input by the inputting unit, perform digital-to-analog conversion processing for the received standard test codes, and output, through an output end, an analog signal obtained after conversion; and transmit the analog signal to an input end of an analog-to-digital converter ADC to be tested, so that the ADC to be tested performs analog-to-digital conversion processing for the analog signal and generates a test code set formed by digital signals; the comparing unit is configured to receive the test code set output by the ADC to be tested, compare the test code set with a second standard test code set, and if the comparison result is in a preset error range, notify the test data collecting unit, or if the comparison result is beyond a preset error range, output the comparison result to the correcting unit; the correcting unit is configured to obtain a complementary code set according to the comparison result when the comparison result in the comparing unit is beyond the preset error range, and input the complementary code set to the inputting unit, so that the inputting unit updates the first standard test code set according to the complementary code set; the test data collecting unit is configured to obtain a voltage value of the input end of the ADC to be tested when the comparison result in the comparing unit is in the preset error range, and calculate, according to the voltage value, static parameters of the ADC to be tested; and the inputting unit is further configured to receive the complementary code set output by the correcting unit, update the first standard test code set according to the complementary code set, obtain the updated first standard test code set, and input the test codes in the updated first standard test code set to the input end of the ADC to be tested.

In combination with the second aspect, in a possible implementation manner, the test circuit further includes an operational amplifier, configured to amplify the analog signal output by the DAC, and input the amplified an analog signal to the ADC to be tested; where, a first input end of the operational amplifier is connected to the output end of the DAC, a second input end of the operational amplifier is grounded, and an output end of the operational amplifier is connected to the input end of the ADC to be tested.

In combination with the second aspect and the preceding possible implementation manner, in a second possible implementation manner, the second standard test code set includes code steps corresponding to code steps in the first standard test code set on a one-to-one basis, and the comparing unit is specifically configured to: subtract a corresponding code step in the second standard test code set from each code step in the test code set output by the ADC to be tested, obtain a difference corresponding to each code step in the test code set, determine whether the difference corresponding to the code step falls within the preset error range, and if yes, notify the test data collecting unit; otherwise, output the difference to the correcting unit; and correspondingly, the correcting unit is specifically configured to: if the difference corresponding to any code step in the test code set falls beyond the preset error range, obtain the difference corresponding to each code step in the test code set, form a complementary code set by using the differences respectively corresponding to all the code steps in the test code set, and input the complementary code set to the inputting unit; where, an arrangement sequence of the differences in the complementary code set is the same as an arrangement sequence of the standard test codes in the first standard test code set.

In combination with the second aspect and the preceding possible implementation manners, in a third possible implementation manner, the inputting unit is specifically configured to: input the standard test codes in the first standard test code set to the input end of the digital-to-analog converter DAC, receive the complementary code set output by the correcting unit, summate each difference in the complementary code set and a corresponding standard test code in the first standard test code set, and form the updated first standard test code set by using all the standard test codes after summation.

In combination with the second aspect and the preceding possible implementation manners, in a fourth possible implementation manner, the test data collecting unit includes a digital converter and a register, where the digital converter is configured to collect the voltage value at the input end of the ADC, and store the voltage value collected at the input end of the ADC into the register.

In a third aspect, an embodiment of the present invention also provides a chip, including the conversion circuit or the test circuit according to any one of the implementation manners of the present invention.

According to the preceding technical solutions, by using the conversion circuit and the chip in the embodiments of the present invention, an ADC and a DAC are connected to form a test loop to achieve the purpose of quickly locking a test code set output by the ADC, and a corresponding analog voltage value at the input end of the ADC is collected for calculating static parameters of the ADC only after the test code set is correctly locked. Thereby, the waste of time caused by multiple collections is avoided, the ADC test time is effectively shortened, and the problem in the prior art that a long test time is required for testing the ADC is solved.

BRIEF DESCRIPTION OF DRAWINGS

To describe the technical solutions of the present invention more clearly, the following briefly introduces the accompanying drawings required for describing the embodiments. Apparently, the accompanying drawings in the following description show merely some embodiments of the present invention, and for persons of ordinary skill in the art, other drawings for implementing the technical solutions of the present invention may still be derived from the accompanying drawing without creative efforts.

DESCRIPTION OF EMBODIMENTS

To make the objectives, technical solutions, and advantages of the present invention more comprehensible, the following describes the technical solutions of the present invention clearly and completely with reference to the accompanying drawings in the embodiments of the present invention. Apparently, the described embodiments are merely a part of the embodiments of the present invention. Based on the described embodiments of the present invention, other embodiments that can solve the technical problem of the present invention and achieve the technical effect of the present invention may be derived by persons of ordinary skill in the art even without creative efforts by making equivalent changes to some or all technical features, and the embodiments derived from such changes apparently shall fall within the scope disclosed by the present invention.

Figure 1:
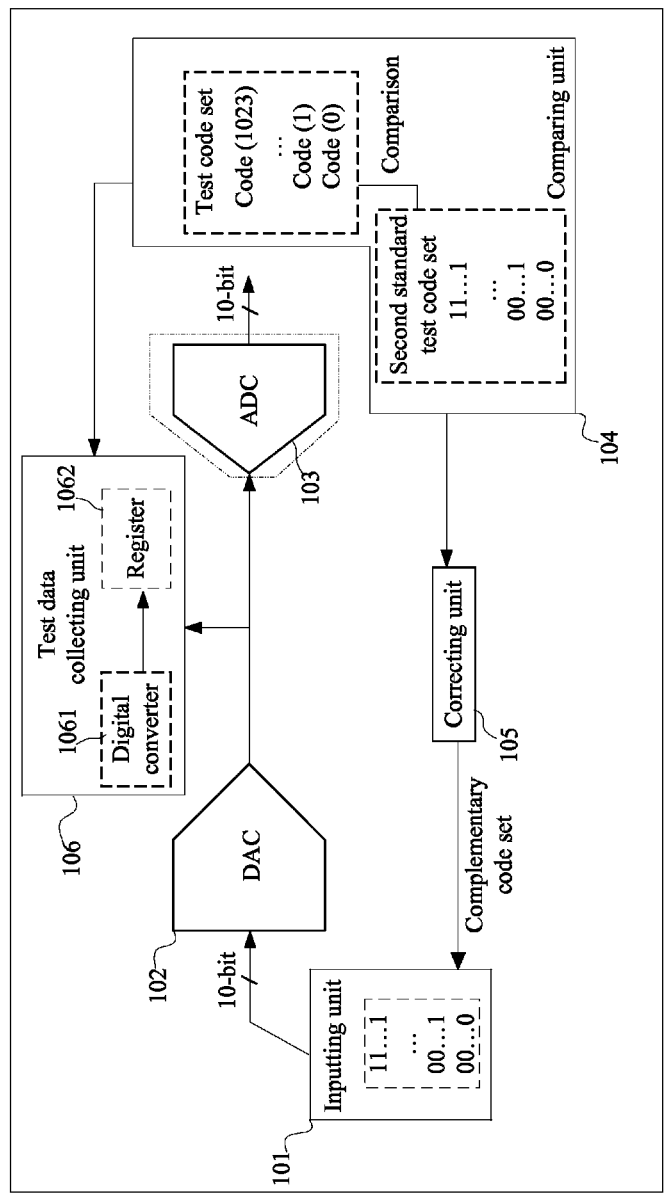
FIG. 1 is a schematic structural diagram of a conversion circuit according to an embodiment of the present invention.

FIG. 1 is a schematic structural diagram of a conversion circuit according to an embodiment of the present invention. As shown in FIG. 1, the conversion circuit 100 in the embodiment includes:

an inputting unit 101, configured to input standard test codes in a first standard test code set to an input end of a digital-to-analog converter 102 (Digital to analog converter, DAC for short);

the DAC 102, configured to perform digital-to-analog conversion processing for the received standard test codes, and output an analog signal obtained after conversion to an analog-to-digital converter 103 (Analog-to-Digital Converter, ADC for short);

the ADC 103, configured to perform analog-to-digital conversion processing for the received an analog signal output by the DAC 102, generate a test code set formed by code steps of digital signals, and output the test code set to a comparing unit 104;

the comparing unit 104, configured to compare the test code set output by the ADC 103 with a second standard test code set, and if the comparison result is in a preset error range, notify a test data collecting unit 106, or if the comparison result is beyond a preset error range, output the comparison result to a correcting unit 105; and the correcting unit 105, configured to obtain a complementary code set according to the comparison result when the comparison result in the comparing unit is beyond the preset error range, and input the complementary code set to the inputting unit 101, so that the inputting unit 101 updates the first standard test code set according to the complementary code set and obtains the updated first standard test code set.

In the embodiment, the test codes in the updated first standard test code set are new test codes formed by adding a corresponding complementary code in the complementary code set to each standard test code in the first standard test code set.

The inputting unit 101 is further configured to input the new test codes to the input end of the DAC 102 again to obtain a group of new an analog signal output by the DAC 102, so as to input to the ADC 103 the new an analog signal output by the DAC 102, so that the comparing unit 104 connected to the ADC 103 compares the test code set output by the ADC 103 again with the second standard test code set; if the comparison result in the comparing unit is beyond the preset error range, corresponding actions of the correcting unit 105, the inputting unit 101, the DAC 102, the ADC 103, and so on are repeated, until the comparison result in the comparing unit is in the preset error range.

In the embodiment, the second standard test code set in the comparing unit is not changed and does not need to be updated. In an actual application, the second standard test code set may be made consistent with the original first standard test code set.

The test data collecting unit 106 is configured to obtain a voltage value of the input end of the ADC when the comparison result in the comparing unit is in the preset error range, and calculate or obtain static parameters of the ADC according to the voltage value.

It should be noted that because the DAC 102 has a one-to-one feature, the inputting unit 101 inputs code steps of the standard test codes in the first standard test code set to the DAC 102 (the code steps are code steps of digital signals), and the DAC 102 performs digital-to-analog conversion processing for the input code steps and then inputs the code steps of an analog signal to the ADC 103 one by one, so that the ADC 103 performs analog-to-digital conversion processing for the code steps of the analog signal output by the DAC and generates a test code set formed by the code steps of digital signals, which is then output to the comparing unit 104.

For example, the output end of the DAC may be directly connected to the input end of the ADC within the chip; or in other embodiments, the output end of the DAC may be connected to the input end of the ADC through a test board, for example, connected through a test board of an automatic test equipment (Automatic Test Equipment, ATE).

In the embodiment of the present invention, a test circuit (or a test apparatus) for an ADC is formed by the inputting unit 101, the DAC 102, the comparing unit 104, the correcting unit 105, and the test data collecting unit; the ADC and the DAC are connected to form a test loop to achieve the purpose of quickly locking a test code set output by the ADC; and a corresponding analog voltage value at the input end of the ADC is collected for calculating static parameters of the ADC after the expected test code set is obtained at the output end of the ADC. Thereby, the ADC test time may be effectively shortened, and the problem in the prior art that a long test time is required for testing the ADC is solved.

It should be noted that in an experiment of testing an ADC, the time consumed by the conversion circuit in the embodiment is reduced by about 10 times, as compared with the time consumed by the histogram ADC test method in the prior art. In an optional application scenario, the DAC shown in FIG. 1 may be a 10-bit DAC, and the ADC may be a 10-bit ADC. "10-bit" is a resolution indicator of the DAC, and "10-bit" is also a resolution indicator of the ADC. Of course, in other embodiments, as long as the resolutions of the DAC and ADC to be tested are the same (for example, 16-bit or 10-bit), the preceding conversion circuit can be used for testing.

In another possible application scenario, the standard test codes in the first standard test code set pre-input to the DAC for the first time by the inputting unit 101 may be decimal linear monotonic codes. For example, the inputting unit 101 may input code steps of linear monotonic codes of 0-1023 one by one according to the sampling rate of the DAC; after the code steps pass through the DAC and ADC, the comparing unit 104 may compare the test code set output by the ADC with the second standard test code set, and obtain a difference corresponding to each code step (obtained by comparing the code steps in the test code set with the code steps in the second standard test code set in sequence), and the difference is the comparison result.

If the difference is beyond the preset error range, the difference is output to the correcting unit 105, and then the correcting unit 105 obtains a complementary code set according to the comparison result and outputs the complementary code set to the inputting unit 101, so that the inputting unit 101 updates the first standard test code set according to the complementary code set to obtain the updated first standard test code set and outputs the test codes in the updated first standard test code set to the input end of the DAC 102 again. The preceding step of obtaining a difference is repeated, until a difference falls within the preset error range. Then the corresponding 1024 voltage values of the input end of the ADC may be used for calculating static parameters of the ADC.

In the embodiment of the present invention, the code steps in the first standard test code set correspond to the code steps in the second standard test code set on a one-to-one basis, that is, in the second standard test code set, there are code steps corresponding to "the code steps in the first standard test code set". Therefore, whether to perform a test or notify the correcting unit of performing correction may be determined by comparing the difference between the first standard test code set and the second standard test code set. The correspondence herein means that all the code steps in the first standard test code set can match the code steps of a consistent format in the second standard test code set. The matching may be position matching, or determination of a specific code step in the second standard test code set according to a pre-designed language condition.

In an actual application, the standard test codes may be decimal linear monotonic codes, for example, 0-1023 in decimal notation.

In a third possible implementation manner, the comparing unit 104 in FIG. 1 is specifically configured to subtract a corresponding code step in the second standard test code set from each code step in the test code set output by the ADC 103, obtain a difference corresponding to each code step in the test code set, determine whether the difference corresponding to the code step falls within the preset error range, and if yes, notify the test data collecting unit 106; otherwise, output the difference to the correcting unit 105.

Correspondingly, the correcting unit 105 is specifically configured to:

if the difference corresponding to at least one code step in the test code set falls beyond the preset error range, obtain the difference corresponding to each code step in the test code set, form a complementary code set by using the differences respectively corresponding to all the code steps in the test code set, and input the complementary code set to the inputting unit.

An arrangement sequence of the differences in the complementary code set is the same as an arrangement sequence of the standard test codes in the first standard test code set. To be specific, the complementary codes in the complementary code set are the differences corresponding to the code steps in the test code set.

Of course, when the comparison result in the comparing unit 104 is beyond the preset error range, the inputting unit 101 is further configured to:

receive the complementary code set output by the correcting unit 105, update the first standard test code set according to the complementary code set, obtain the updated first standard test code set, and transmit the test codes in the updated first standard test code set to the input end of the DAC.

Specifically, the inputting unit 101 is configured to receive the complementary code set output by the correcting unit 105, summate each difference, namely, a complementary code, in the complementary code set and a corresponding standard test code in the first standard test code set, and form the updated first standard test code set by using all the standard test codes after summation.

To describe the test working methodology, herein a 10-bit $511^{th}$ (decimal) code is used as an example for description: The $511^{th}$ code, namely, binary 0111111111, is input to the DAC. Then 0111111100 is obtained at the output end of the ADC (assuming that the corresponding value at the input end of the ADC is 1.135 v). From the comparing unit, it is known that the value is less than an ideal target value 0111111111 by 0000000011. The correcting unit adds the difference to the original $511^{th}$ code, that is, the correcting unit adds 0000000011 to 0111111111 to obtain the code 1000000010 and then inputs the code to the input end of the DAC again. Then the output of the DAC or the input of the ADC is increased, and the expected output value of the ADC is 0111111111, namely, the ideal target value. The corresponding input value (assumed to be 1.150 v) of the ADC is recorded or collected. Similarly, other 1023 codes are processed, and complete data required by a static test of the ADC is obtained.

In a fourth application scenario, the test data collecting unit 106 includes a digital converter (such as ATE Digitizer) 1061 and a register 1062. As shown in FIG. 1, the digital converter 1061 is configured to collect a voltage value at the input end of the ADC 103, and store the collected voltage value into the register 1062, so that static parameters of the ADC may be calculated according to the voltage value subsequently.

In a fifth application scenario, the comparing unit 104 in the conversion circuit may include a register, a difference obtaining unit, and a notifying unit.

The register is configured to store the second standard test code set and the test code set output by the ADC 103.

The difference obtaining unit is configured to obtain a difference between the test code set output by the ADC 103 and the second standard test code set, and compare the difference with the preset error range.

The notifying unit notifies the test data collecting unit 106 if the difference obtained by the difference obtaining unit is in the preset error range; otherwise, input the obtained difference to the correcting unit 105.

Further, when the ADC is tested, the DAC is tested additionally. That is, the test data collecting unit 106 may further collect a voltage value of the output end of the DAC, for calculating static parameters of the DAC, so that the static parameters of the DAC may be tested when the ADC is tested. In this case, the digital converter in the data collecting unit may be configured to collect the voltage value of the output end of the DAC, and store the voltage value of the output end of the DAC into the register.

It should be noted that the test data collecting unit 106 is configured to obtain the first voltage value output by the output end of the DAC, so as to calculate the static parameters of the DAC and further measure whether the DAC to be tested complies with design specification indicators. That is, the inputting unit 101 inputs the standard test codes in the original first standard test code set to the DAC 102, so that the DAC 102 performs digital-to-analog conversion processing for the received standard test codes. In this case, the test data collecting unit 106 obtains the voltage value of the output end of the DAC to calculate the static parameters of the DAC.

By using the conversion circuit in the embodiment, an ADC and a DAC are connected to form a test loop to achieve the purpose of quickly locking a test code set output by the ADC, so that the test of an ADC having a many-to-one transmission performance curve is transformed to the test of an ADC using a simple one-to-one test method. Therefore, the time consumed for testing the ADC by the conversion circuit in the embodiment is reduced by about 10 times, as compared with the time consumed by the histogram ADC test method in the prior art.

Figure 2:
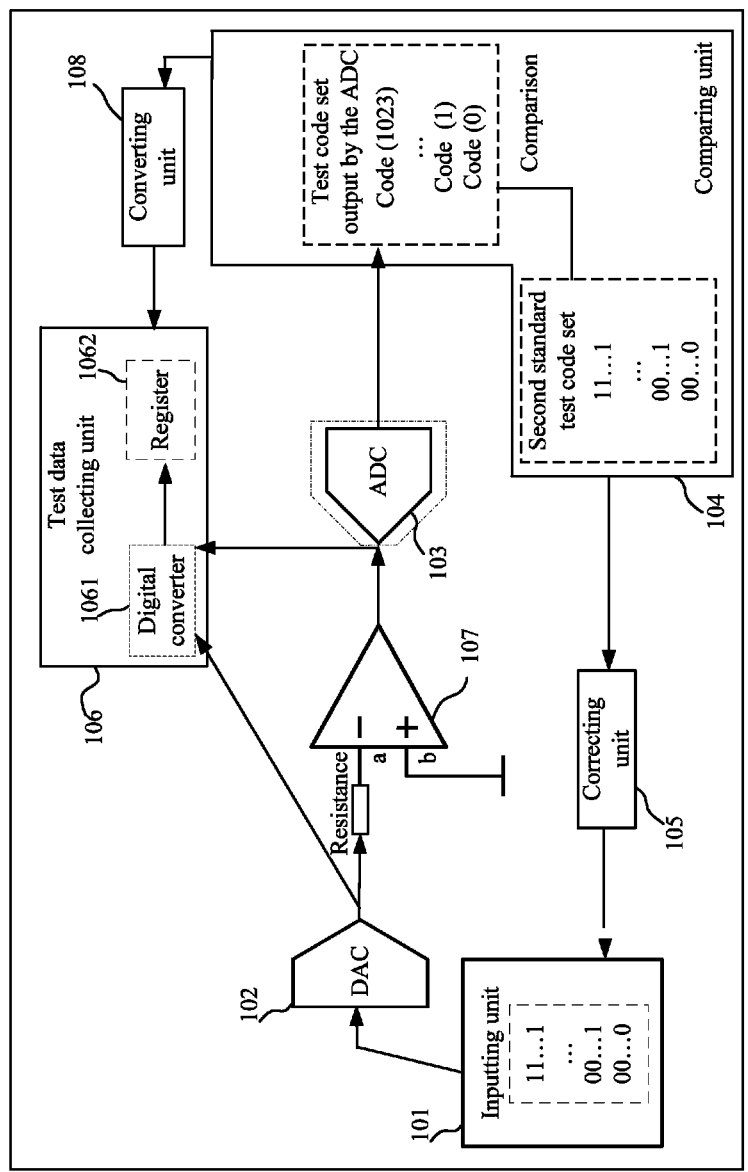
FIG. 2 is a schematic structural diagram of a conversion circuit according to another embodiment of the present invention.

FIG. 2 is a schematic structural diagram of a conversion circuit according to another embodiment of the present invention. As shown in FIG. 2, the conversion circuit in the embodiment differs from the conversion circuit shown in FIG. 1 in that the conversion circuit in the embodiment further includes an operational amplifier 107, which is configured to amplify the signals output by the DAC 102 and input the amplified signals to the ADC 103.

Specifically, a first input end of the operational amplifier 107 is connected to the output end of the DAC 102, a second input end b of the operational amplifier 107 is grounded, and an output end of the operational amplifier 107 is connected to the input end of the ADC 103.

In an actual application, the operational amplifier 107 (Op-amp) is installed on a test board located between the output end of the DAC and the input end of the ADC. An amplification ratio may be set according to the output voltage range of the DAC and the input voltage range of the ADC to ensure that the actual input voltage of the ADC is slightly higher the standard input voltage range of the ADC. Thereby, it may be ensured that all-0 codes (Code (0)) and all-1 codes (Code (1023)) passing through the ADC will not be lost.

In particular, FIG. 2 further shows a converting unit 108 located between the test data collecting unit 106 and the comparing unit 104. The converting unit 108 is configured to convert the signals output by the comparing unit 104 into signals that can be recognized by the test data collecting unit 106. Of course, in an ideal state, when the comparison result in the comparing unit 104 is in the preset error range, the test data collecting unit may be notified directly, so that the static parameters of the ADC are calculated. However, in an actual application, if the signals output by the comparing unit 104 are digital signals, while the test data collecting unit 106 can only recognize an analog signal, it is necessary to convert the digital signals output by the comparing unit into an analog signal.

In FIG. 2, the resolutions of the DAC and ADC are both 10-bit, and the sampling frequency of the DAC is 1.0833 MHz.

In an optional application scenario, the test data collecting unit 106 in the conversion circuit may be a voltmeter, which obtains the voltage value of the input end of the ADC 103 in a semi-manual manner. For example, a voltmeter is arranged at the input end of the ADC 103. When the comparison result in the comparing unit falls within the preset error range, an operator may record the voltage value of the voltmeter, and obtain the static parameters of the ADC according to the voltage value.

Optionally, the voltage value of the DAC may also be obtained by using a voltmeter, for example, by arranging a voltmeter at the output end of the DAC. In an actual application, the conversion circuit may be located on a chip. The conversion chip and a design for test (Design for Test, DFT) circuit on the chip may be used together to perform a built-in self test (Built-in Self Test, BIST); or when the chip does not include a DFT circuit, an external DAC may be used to assist in the ADC test.

Compared with the histogram ADC test method based on multi-point sampling in the prior art, the conversion circuit is more direct. In the embodiment, the data output by the ADC corresponds to the data input to the ADC on a one-to-one basis, which facilitates quick collecting of test data and easy locating of a faulty chip.

Further, the existing resources for testing the DAC on the chip may be used to simultaneously test the DAC and ADC on the ATE, so that the total test time for testing the DAC and ADC is shortened by more than 10 times and the test cost for mass production of chips is greatly reduced.

According to another aspect of the present invention, the present invention further provides a chip. The chip includes the conversion circuit described in any one of the embodiments of the present invention.

Finally, it should be noted that the embodiments are intended for describing the technical solutions of the present invention rather than limiting the present invention. Although the present invention is described in detail with reference to the foregoing embodiments, persons of ordinary skill in the art should understand that modifications and substitutions can be made to the technical solutions of the embodiments or to all or some technical features thereof without departing from the scope of the technical solutions of the embodiments of the present invention.

What is claimed is:

1. A conversion circuit, wherein the conversion circuit comprises an inputting unit, a digital-to-analog converter (DAC), an analog-to-digital converter (ADC), a comparing unit, a correcting unit, and a test data collecting unit, wherein:
the inputting unit is configured to input standard test codes in a first standard test code set to an input end of the DAC;
the DAC is configured to receive the standard test codes input by the inputting unit, perform digital-to-analog conversion processing for the received standard test codes, and output, through an output end of the DAC, an analog signal obtained after the digital-to-analog conversion;
the ADC is configured to receive, through an input end of the ADC, the analog signal output by the DAC, perform analog-to-digital conversion processing for the analog signal, and generate a test code set formed by digital signals obtained after the analog-to-digital conversion;
the comparing unit is configured to compare the test code set output by the ADC with a second standard test code set, and if a comparison result is in a preset error range, notify the test data collecting unit, or if the comparison result is beyond the preset error range, output the comparison result to the correcting unit;
the correcting unit is configured to obtain a complementary code set according to the comparison result when the comparison result in the comparing unit is beyond the preset error range, and input the complementary code set to the inputting unit, so that the inputting unit updates the first standard test code set according to the complementary code set;
the test data collecting unit is configured to obtain a voltage value of the input end of the ADC when the comparison result in the comparing unit is in the preset error range; and
the inputting unit is further configured to receive the complementary code set output by the correcting unit, update the first standard test code set according to the complementary code set, obtain the updated first standard test code set, and input the test codes in the updated first standard test code set to the input end of the DAC.

2. The conversion circuit according to claim 1, wherein the output end of the DAC is connected to the input end of the ADC through a test board.

3. The conversion circuit according to claim 1, wherein the standard test codes are decimal linear monotonic codes.

4. The conversion circuit according to claim 1, further comprising:
an operational amplifier, configured to amplify the analog signal output by the DAC, and input the amplified analog signal to the ADC;
wherein, a first input end of the operational amplifier is connected to the output end of the DAC, a second input end of the operational amplifier is grounded, and an output end of the operational amplifier is connected to the input end of the ADC.

5. The conversion circuit according to claim 1, wherein the test data collecting unit comprises a digital converter and a register, wherein the digital converter is configured to collect the voltage value at the input end of the ADC when the comparison result in the comparing unit is in the preset error range, and store the voltage value collected at the input end of the ADC into the register, for obtaining a static parameter of the ADC.

6. The conversion circuit according to claim 1, wherein the test data collecting unit is further configured to obtain a voltage value of the output end of the DAC, for obtaining a static parameter of the DAC.

7. The conversion circuit according to claim 1, wherein: the second standard test code set comprises code steps corresponding to code steps in the first standard test code set on a one-to-one basis, and the comparing unit is configured to:
subtract a corresponding code step in the second standard test code set from each code step in the test code set output by the ADC, obtain a difference corresponding to each code step in the test code set, determine whether at least one of the differences corresponding to at least one of the code step falls within the preset error range, and if the at least one of the differences corresponding to the at least one of the code step falls within the preset error range, notify the test data collecting unit; otherwise, output the at least one of the differences to the correcting unit; and
correspondingly, the correcting unit is configured to:
if each of the differences corresponding to any code step in the test code set falls beyond the preset error range, obtain each of the differences corresponding to each code step in the test code set, form a complementary code set by using the differences respectively corresponding to all the code steps in the test code set, and input the complementary code set to the inputting unit;
wherein, an arrangement sequence of the differences in the complementary code set is the same as an arrangement sequence of the standard test codes in the first standard test code set.

8. The conversion circuit according to claim 1, wherein the inputting unit is configured to: input the standard test codes in the first standard test code set to the input end of the DAC, receive the complementary code set output by the correcting unit, summate each difference in the complementary code set and a corresponding standard test code in the first standard test code set, and form the updated first standard test code set by using all the standard test codes after summation.

9. A test circuit, wherein the test circuit comprises an inputting unit, a digital-to-analog converter (DAC), a comparing unit, a correcting unit, and a test data collecting unit, wherein:

the inputting unit is configured to transmit standard test codes in a first standard test code set to an input end of the DAC;
the DAC is configured to receive the standard test codes input by the inputting unit, perform digital-to-analog conversion processing for the received standard test codes, and output, through an output end of the DAC, an analog signal obtained after the digital-to-analog conversion processing; and transmit the analog signal to an input end of an analog-to-digital converter ADC to be tested, so that the ADC to be tested performs analog-to-digital conversion processing for the analog signal and generates a test code set formed by digital signals obtained after the analog-to-digital conversion processing;
the comparing unit is configured to receive the test code set output by the ADC to be tested, compare the test code set with a second standard test code set, and if a comparison result is in a preset error range, notify the test data collecting unit, or if the comparison result is beyond the preset error range, output the comparison result to the correcting unit;
the correcting unit is configured to obtain a complementary code set according to the comparison result when the comparison result in the comparing unit is beyond the preset error range, and input the complementary code set to the inputting unit, so that the inputting unit updates the first standard test code set according to the complementary code set;
the test data collecting unit is configured to obtain a voltage value of the input end of the ADC to be tested when the comparison result in the comparing unit is in the preset error range; and
the inputting unit is further configured to receive the complementary code set output by the correcting unit, update the first standard test code set according to the complementary code set, obtain the updated first standard test code set, and input the test codes in the updated first standard test code set to the input end of the ADC to be tested.

10. The test circuit according to claim 9, further comprising:
an operational amplifier, configured to amplify the analog signal output by the DAC, and input the amplified analog signal to the ADC to be tested;
wherein, a first input end of the operational amplifier is connected to the output end of the DAC, a second input end of the operational amplifier is grounded, and an output end of the operational amplifier is connected to the input end of the ADC to be tested.

11. The test circuit according to claim 9, wherein: the second standard test code set comprises code steps corresponding to code steps in the first standard test code set on a one-to-one basis, and the comparing unit is configured to:
subtract a corresponding code step in the second standard test code set from each code step in the test code set output by the ADC to be tested, obtain a difference corresponding to each code step in the test code set, determine whether at least one of the differences corresponding to at least one of the code steps falls within the preset error range, and if the at least one of the differences corresponding to the at least one of the code steps falls within the preset error range, notify the test data collecting unit; otherwise, output the at least one of the differences to the correcting unit; and correspondingly, the correcting unit is configured to:
if each of the differences corresponding to any code step in the test code set falls beyond the preset error range, obtain each of the differences corresponding to each code step in the test code set, form a complementary code set by using the differences respectively corresponding to all the code steps in the test code set, and input the complementary code set to the inputting unit;
wherein, an arrangement sequence of the differences in the complementary code set is the same as an arrangement sequence of the standard test codes in the first standard test code set.

12. The test circuit according to claim 9, wherein the inputting unit is configured to: input the standard test codes in the first standard test code set to the input end of the DAC, receive the complementary code set output by the correcting unit, summate each difference in the complementary code set and a corresponding standard test code in the first standard test code set, and form the updated first standard test code set by using all the standard test codes after summation.

13. The test circuit according to claim 9, wherein the test data collecting unit comprises a digital converter and a register, wherein the digital converter is configured to collect the voltage value at the input end of the ADC when the comparison result in the comparing unit is in the preset error range, and store the voltage value collected at the input end of the ADC into the register, for obtaining a static parameter of the ADC.

\* \* \* \* \*

UNITED STATES PATENT AND TRADEMARK OFFICE
CERTIFICATE OF CORRECTION

| | | |
|---|---|---|
| PATENT NO. | : 8,890,731 B2 | Page 1 of 1 |
| APPLICATION NO. | : 14/084309 | |
| DATED | : November 18, 2014 | |
| INVENTOR(S) | : Deng et al. | |

It is certified that error appears in the above-identified patent and that said Letters Patent is hereby corrected as shown below:

On the title page item [71]

Hauwei Technologies Co., Ltd., Guangdong (CN)

should read

Hauwei Technologies Co., Ltd., Shenzhen (CN)

Signed and Sealed this
Ninth Day of June, 2015

Michelle K. Lee
*Director of the United States Patent and Trademark Office*